United States Patent
Lin et al.

(10) Patent No.: US 9,136,356 B2
(45) Date of Patent: Sep. 15, 2015

(54) NON-PLANAR FIELD EFFECT TRANSISTOR HAVING A SEMICONDUCTOR FIN AND METHOD FOR MANUFACTURING

(71) Applicant: TAIWAN SEMICONDUCTOR MANUFACTURING CO., LTD., Hsinchu (TW)

(72) Inventors: Chien-Chih Lin, Hsinchu (TW); Long-Jie Hong, Hsinchu (TW); Chih-Lin Wang, Zhubei (TW); Chia-Der Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/176,873

(22) Filed: Feb. 10, 2014

(65) Prior Publication Data
US 2015/0228763 A1 Aug. 13, 2015

(51) Int. Cl.
*H01L 29/78* (2006.01)
*H01L 29/66* (2006.01)
*H01L 29/06* (2006.01)
*H01L 21/311* (2006.01)

(52) U.S. Cl.
CPC ........ *H01L 29/66795* (2013.01); *H01L 21/311* (2013.01); *H01L 29/0649* (2013.01); *H01L 29/66545* (2013.01); *H01L 29/785* (2013.01)

(58) Field of Classification Search
CPC ............ H01L 29/785; H01L 29/66795; H01L 29/812; H01L 29/8126
See application file for complete search history.

(56) References Cited

U.S. PATENT DOCUMENTS

| | | | | |
|---|---|---|---|---|
| 2006/0286755 A1* | 12/2006 | Brask et al. | | 438/299 |
| 2011/0092039 A1* | 4/2011 | Kim et al. | | 438/270 |
| 2011/0291196 A1* | 12/2011 | Wei et al. | | 257/365 |
| 2013/0140629 A1* | 6/2013 | Grupp et al. | | 257/329 |
| 2013/0256764 A1* | 10/2013 | Liaw | | 257/288 |

* cited by examiner

*Primary Examiner* — Allen Parker
(74) *Attorney, Agent, or Firm* — Maschoff Brennan

(57) ABSTRACT

A method for manufacturing a semiconductor device includes forming two isolation structures in a substrate to define a fin structure between the two isolation structures in the substrate. A dummy gate and spacers are formed bridging the two isolation structures and over the fin structure. The two isolation structures are etched with the dummy gate and the spacers as a mask to form a plurality of slopes under the spacers in the two isolation structures. A gate etch stop layer is formed overlying the plurality of slopes. The dummy gate and the two isolation structures beneath the dummy gate are removed to create a cavity confined by the spacers and the gate etch stop layer. A gate is then formed in the cavity.

20 Claims, 8 Drawing Sheets

NON-PLANAR FIELD EFFECT TRANSISTOR HAVING A SEMICONDUCTOR FIN AND METHOD FOR MANUFACTURING

BACKGROUND

The semiconductor integrated circuit (IC) industry has experienced rapid growth. Over the course of the growth, functional density of the semiconductor devices has increased with decrease of device feature size or geometry. The scaling down process generally provides benefits by increasing production efficiency, reducing costs, and/or improving device performance. However, such scaling down has also increased complexity of the IC manufacturing processes.

With the demands on shrinking geometry of ICs, a non-planar field effect transistor (FET) is introduced. The non-planar FET has a semiconductor fin and a gate located on top of the semiconductor fin. However, device performance of such semiconductor device is still not satisfactory in advanced applications of technology. Therefore, improvements in structures and methods of forming a semiconductor device with better device performance continue to be sought.

BRIEF DESCRIPTION OF THE DRAWINGS

The invention can be more fully understood by reading the following detailed description of the embodiment, with reference made to the accompanying drawings as follows.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, an element includes embodiments having two or more such elements, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Figure 1:
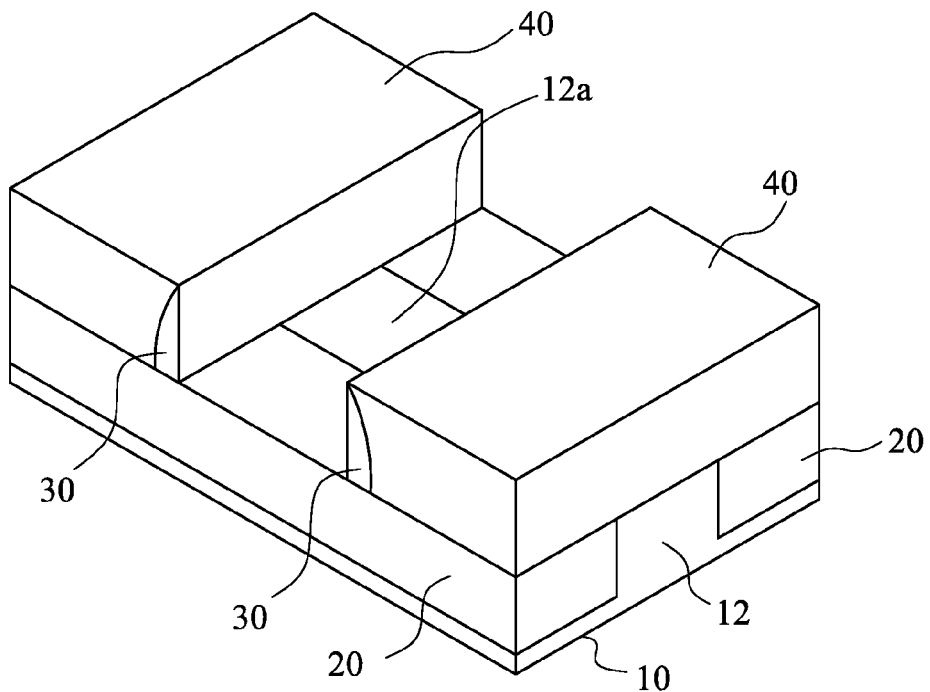
FIG. 1 is a stereoscopic view of a general semiconductor device.

FIG. 1 is a stereoscopic view of a general semiconductor device. The semiconductor device has a substrate 10, a fin structure 12, two isolation structures 20, two spacers 30 and an inter-layer dielectric (ILD) layer 40. The fin structure 12 is located over the substrate 10 and between the two isolation structures 20. A gate (not shown) is disposed in a cavity (not marked) confined by the two spacers 30, the fin structure 12 and the isolation structures 20; that is, the gate is disposed between the two spacers 30 and over the fin structure 12 and the isolation structures 20. The gate contacts an upper surface of a portion 12a of the fin structure 12. The portion 12a of the fin structure 12 may be acted as a channel region. Another portions of the fin structure 12 under the ILD layer 40 may be acted as source/drain regions. However, device performance of such semiconductor device is not satisfactory in advanced applications of technology since a contact area between the gate and the fin structure 12 is small.

Figure 2:
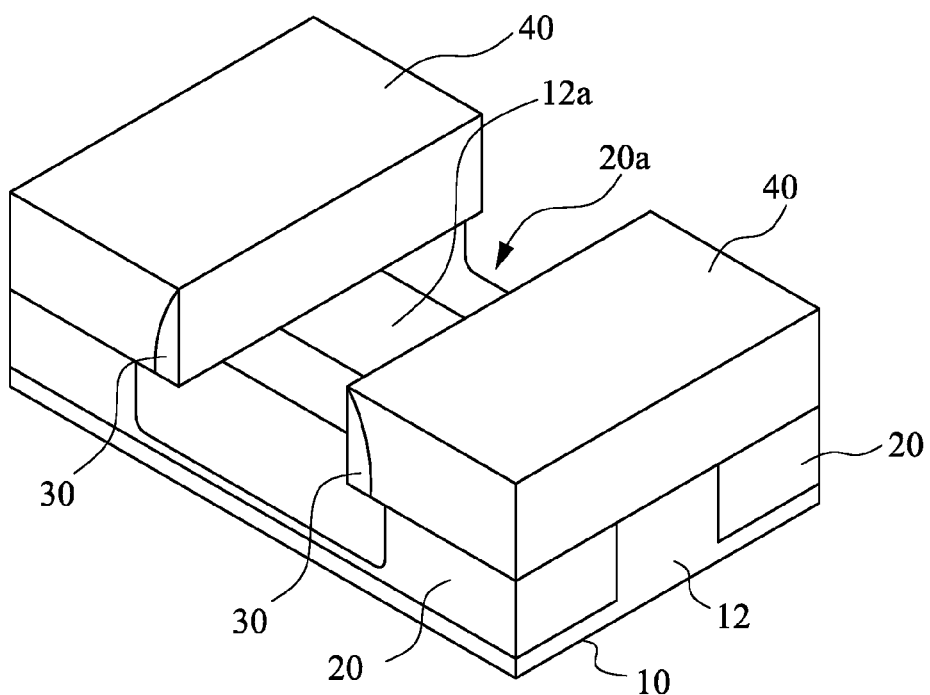
FIG. 2 is a stereoscopic view of another general semiconductor device.

In order to gain more device performance, another semiconductor device is provided, as shown in FIG. 2. Each of the isolation structures 20 of FIG. 1 is etched to form a cavity 20a, and a gate (not shown) may then be formed in the cavity 20a and between the spacers 30. A contact area between the gate and the fin structure 12 is increased compared to that of FIG. 1 due to larger exposed surface of the fin structure 12 before forming the gate. Accordingly, device performance of the semiconductor device and ability of the gate on channel conductivity control may be enhanced. Nevertheless, lateral etch occurs when the isolation structures 20 are etched, and thus the gate formed later will have a wide bottom, which may result in increase of overlap capacitance (Cov) between the gate and the source/drain regions (i.e., the portions of the fin structure 12 under the ILD layer 40) and increase of gate leakage current (Igi). Specifically, the wide bottom of the gate may contact the source/drain regions, which leads to high overlap capacitance. The distance between two adjacent gates is shortened due to wide bottoms of the gates, resulting in increase of gate leakage current. In view of the above problems, a gate etch stop layer is provided to prevent lateral etch when the isolation structures 20 are etched, and thus to prevent increase of overlap capacitance between gate and source/drain regions and gate leakage current. Embodiments of the present disclosure will be described in detail below.

Figure 3:
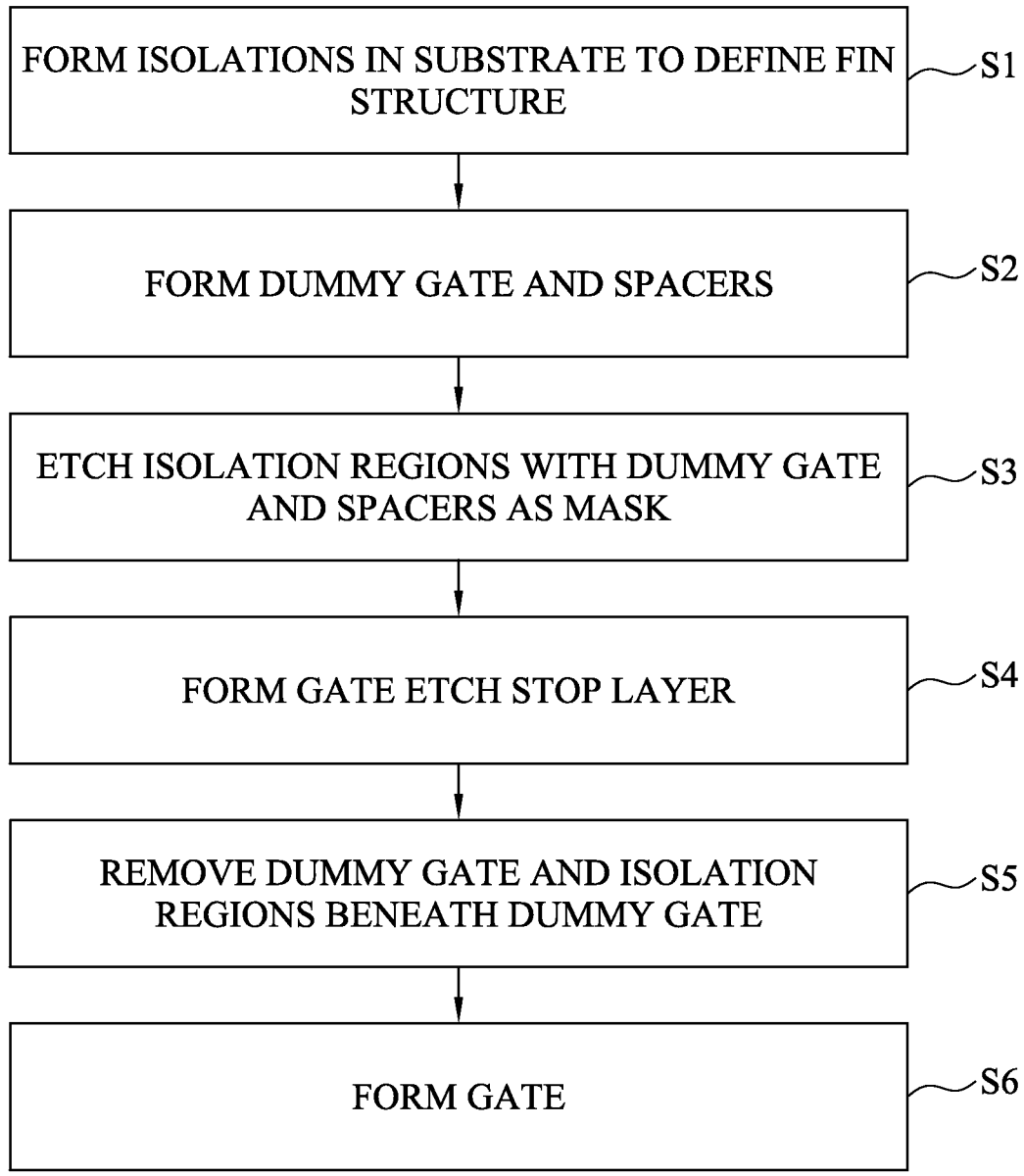
FIG. 3 is a flow chart illustrating a method for manufacturing a semiconductor device according to various embodiments of the present disclosure.

One aspect of the present disclosure provides a method for manufacturing a semiconductor device. FIG. 3 is a flow chart illustrating a method for manufacturing a semiconductor device according to various embodiments of the present disclosure. Operations of the method in FIG. 3 are explained in FIGS. 4A-4K, which are stereoscopic views at various stages of manufacturing a semiconductor device according to various embodiments of the present disclosure. It should be understood that FIGS. 4A-4K are illustrative only and not intended to be limiting.

Figure 4A:
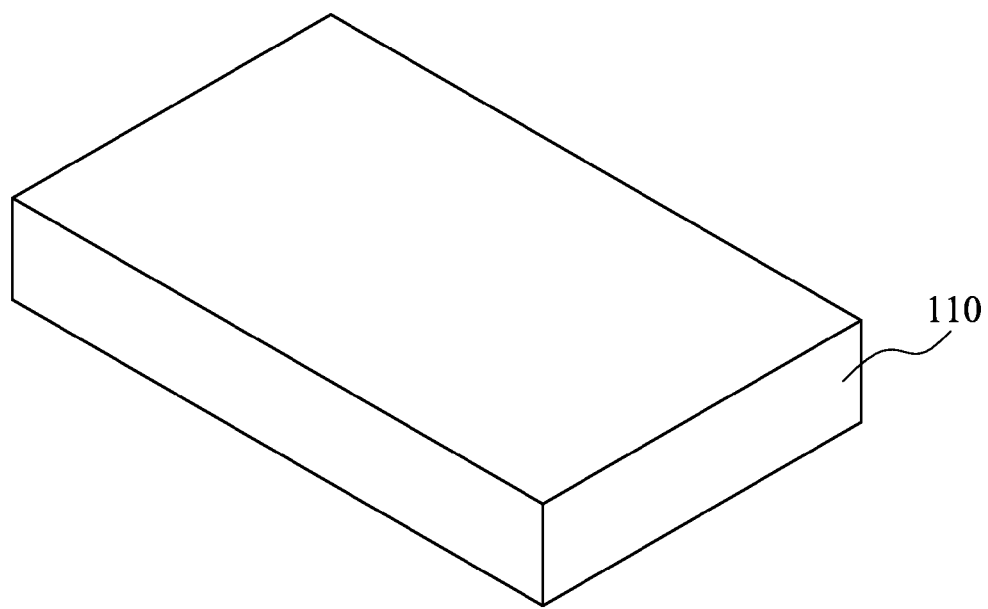
FIGS. 4A-4K are stereoscopic views at various stages of manufacturing a semiconductor device according to various embodiments of the present disclosure.

Referring to FIG. 4A, a substrate 110 is provided. The substrate 110 may include an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof.

Figure 4B:
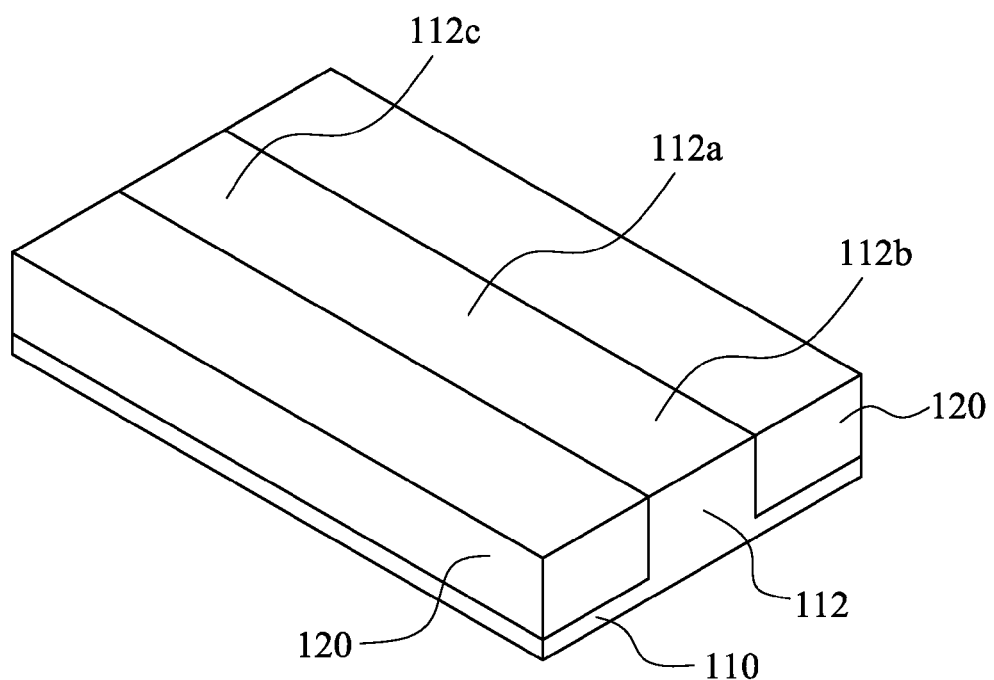

In operation S1, two isolation structures 120 are formed in the substrate 110 to define a fin structure 112 between the two isolation structures 120 in the substrate 110, as shown in FIG. 4B. The isolation structures 120 may be a single layer or a multi-layer structure. The isolation structures 120 may be formed of silicon oxide, silicon nitride, silicon oxynitride, fluoride-doped silicate glass (FSG), a low-k dielectric material, and/or other suitable insulating materials. The isolation structures 120 may be shallow trench isolation (STI) features. In various embodiments, the isolation structures 120 are STI features and formed by etching trenches in the substrate 110 of FIG. 4A, filling isolating material in the trenches, and performing a chemical mechanical polish (CMP) process. Other techniques for fabricating the isolation structures 120 are possible.

The fin structure 112 may be fabricated using suitable processes including photolithography and etch processes. The photolithography process may include forming a photoresist layer (not shown) overlying the substrate 110 of FIG. 4A, exposing the photoresist layer to form a pattern, performing post-exposure bake processes, and developing the pattern to form a masking element. The masking element is used to protect portions of the substrate 110 while forming trenches in the substrate 110 by the etching process, leaving the extending fin structure 112. For example, the trenches may be formed using reactive ion etch (RIE) and/or other suitable processes. Numerous other embodiments of methods to form the fin structure 112 in the substrate 110 may be suitable. After the formation of the fin structure 112, source and drain regions 112b, 112c may be formed at two opposite ends of the fin structure 112. A channel region 112a is between the source and drain regions 112b, 112c. The source and drain regions 112b, 112c may be formed by any suitable method, such as growing by selective epitaxy.

Figure 4C:
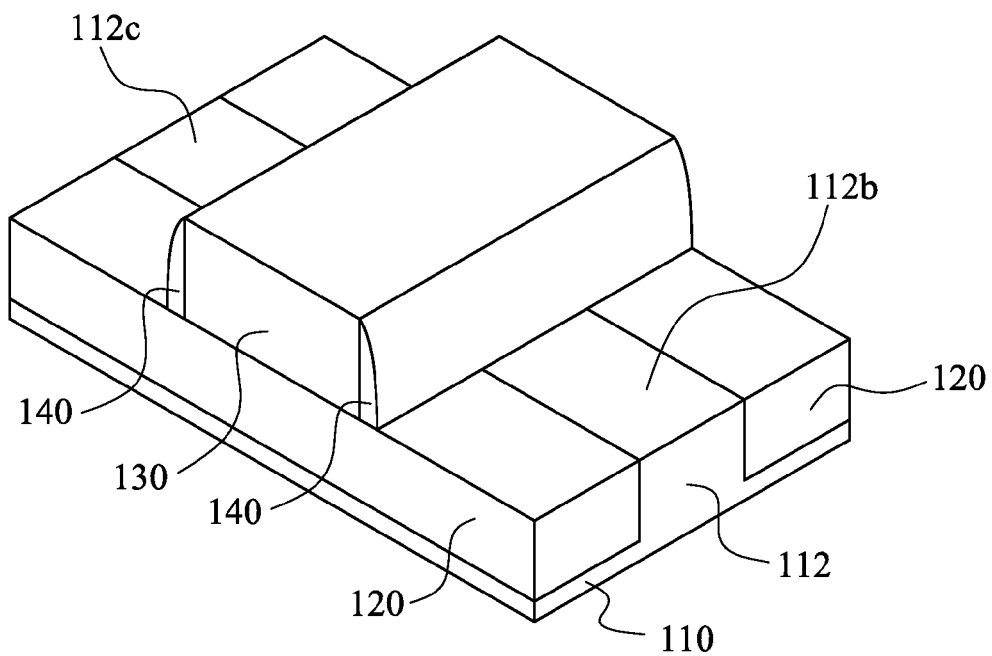

In operation S2, a dummy gate 130 and spacers 140 are formed bridging the two isolation structures 120 and over the fin structure 112, as shown in FIG. 4C. The dummy gate 130 covers the channel region 112a of FIG. 4B and does not cover the source and drain regions 112b, 112c. The dummy gate 130 will be removed later (i.e., following operation S5), and a conductive material may then be deposited to form a real gate (i.e., following operation S6). The dummy gate 130 may be made of polysilicon, amorphous silicon or other suitable materials and fabricated by deposition, such as chemical vapor deposition (CVD) or physical vapor deposition (PVD). The spacers 140 are formed on both sides of the dummy gate 130. For example, a dielectric material (not shown) may be deposited and then etched to form the spacers 140 on two opposite sides of the dummy gate 130. The spacers 140 may be made of silicon oxide, silicon nitride, silicon oxynitride, silicon carbon nitride, or other suitable materials.

Figure 4D:
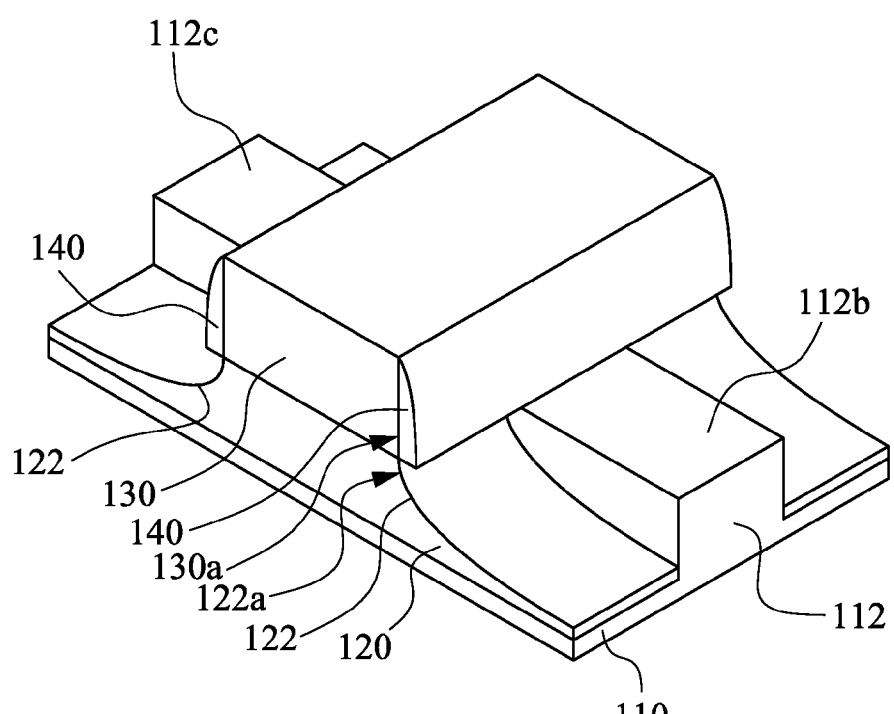

In operation S3, as shown in FIG. 4D, the two isolation structures 120 are etched with the dummy gate 130 and the spacers 140 as a mask to form a plurality of slopes 122 under the spacers 140 in the two isolation structures 120. In various embodiments, dry etch, wet etch or dry etch and wet etch are employed to etch the isolation structures 120 to a position under the spacers 140. In various embodiments, each of the plurality of slopes 122 has an edge 122a substantially aligned with an edge 130a of the dummy gate 130; therefore, the etch process conditions should be precisely controlled to etch the isolation structures 120 to a desired position substantially aligned with the edge 130a of the dummy gate 130. In some embodiments, the spacers 140 of FIG. 4C may be trimmed to decrease a width thereof, and thus the isolation structures 120 may be easily etched to the desired position substantially aligned with the edge 130a of the dummy gate 130.

Figure 4E:
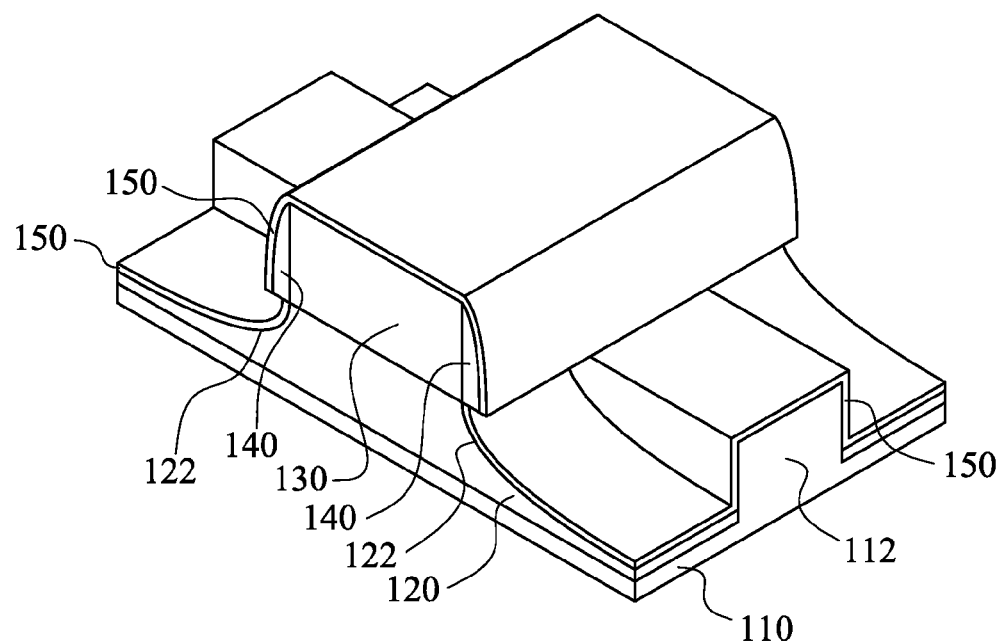

In operation S4, a gate etch stop layer 150 is formed overlying the plurality of slopes 122, as shown in FIG. 4E. Specifically, the gate etch stop layer 150 may be formed overlying the plurality of slopes 122, the spacers 140, the dummy gate 130 and the fin structure 112. In various embodiments, operation S4 is conducted by depositing a dielectric material overlying the plurality of slopes 122. In various embodiments, the dielectric material includes silicon nitride, silicon carbon nitride, or a combination thereof. It is noteworthy that the gate etch stop layer 150 is configured to prevent lateral etch during removing the dummy gate 130 and the isolation structures 120 therebeneath (i.e., operation S5); therefore, the gate etch stop layer 150 should be located under the spacers 140 to effectively prevent lateral etch. Accordingly, in operation S3, the isolation structures 120 should be etched to the position under the spacers 140, as shown in FIG. 4D. Moreover, a thickness of the gate etch stop layer 150 may be appropriately adjusted to prevent lateral etch and not limited.

Figure 4F:
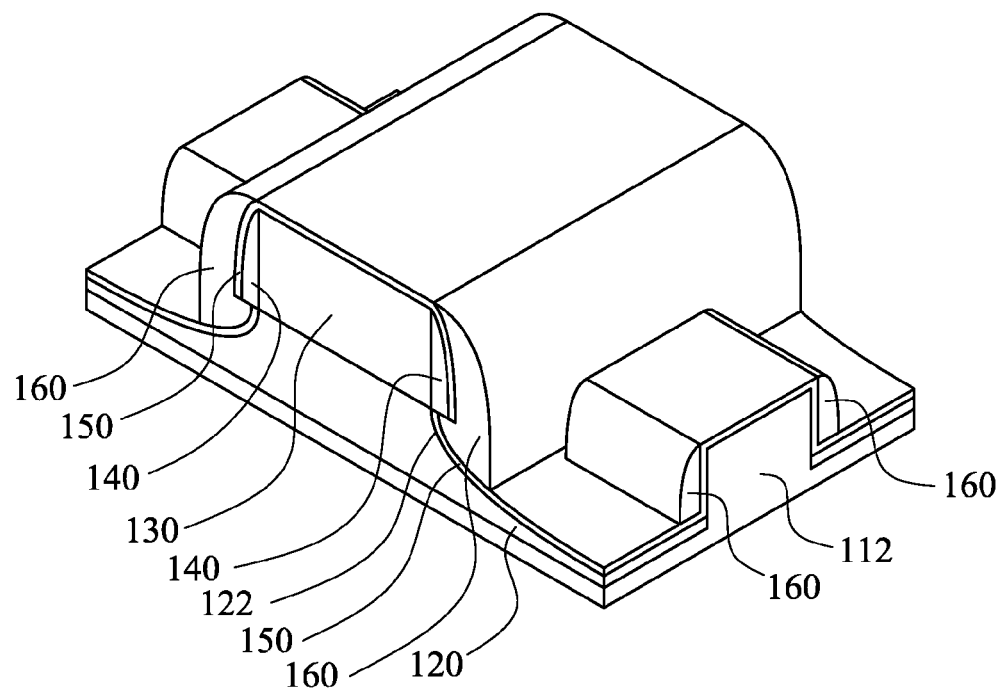

In various embodiments, as shown in FIG. 4F, after operation S4 and before operation S5, an optional insulating layer 160 is formed covering the spacers 140 and the gate etch stop layer 150 thereunder. The insulating layer 160 may be used to fill the space under the spacers 140 (referring to FIG. 4E) and acted as sidewalls of the dummy gate 130. The insulating layer 160 may also be formed on both sides of the fin structure 112. For example, a dielectric material may be deposited and then etched to form the insulating layer 160 covering the spacers 140 and both sides of the fin structure 112. The insulating layer 160 may be made of silicon oxide, silicon nitride, silicon oxynitride, silicon carbon nitride, or other suitable materials.

Figure 4G:
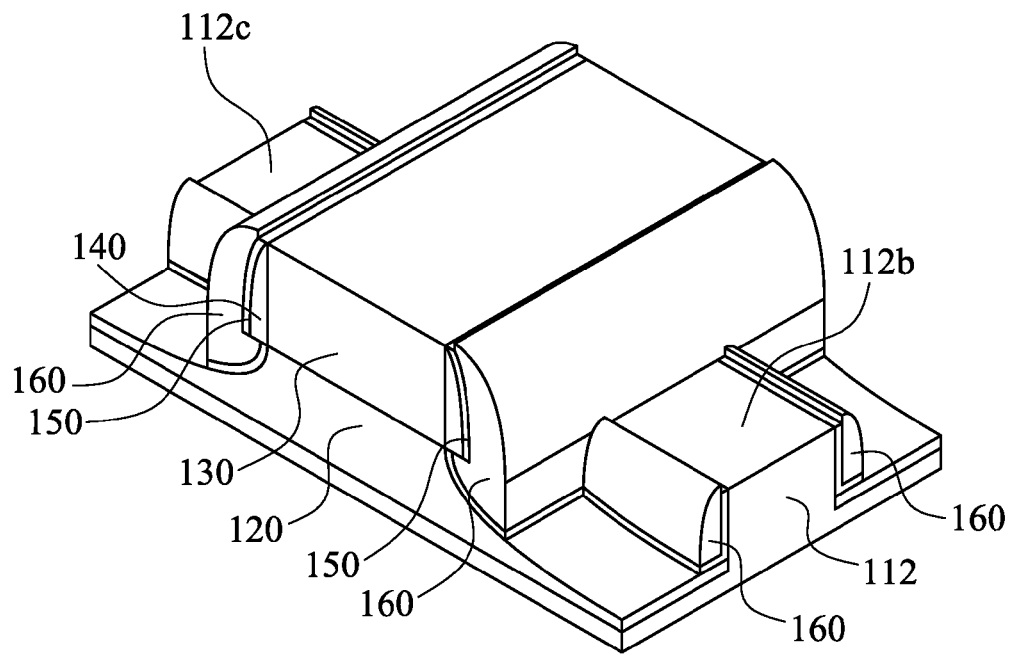

In various embodiments, as shown in FIG. 4G, the gate etch stop layer 150 covering the dummy gate 130 and the fin structure 112 is optionally removed to expose an upper surface of the dummy gate 130 and upper surfaces of the source and drain regions 112b, 112c. The gate etch stop layer 150 covering the dummy gate 130 may be removed to reduce process complexity of removing the dummy gate 130 and the isolation structures 120 therebeneath (i.e., operation S5). In addition, a plurality of contact elements (e.g., contact plugs) may be formed in subsequent processes to connect the source/drain regions 112b, 112c. Accordingly, the gate etch stop layer 150 covering the source/drain regions 112b, 112c may be removed to reduce process complexity of forming contact windows, which are configured to expose upper surfaces of the source/drain regions 112b, 112c and to accommodate the contact elements.

Figure 4H:
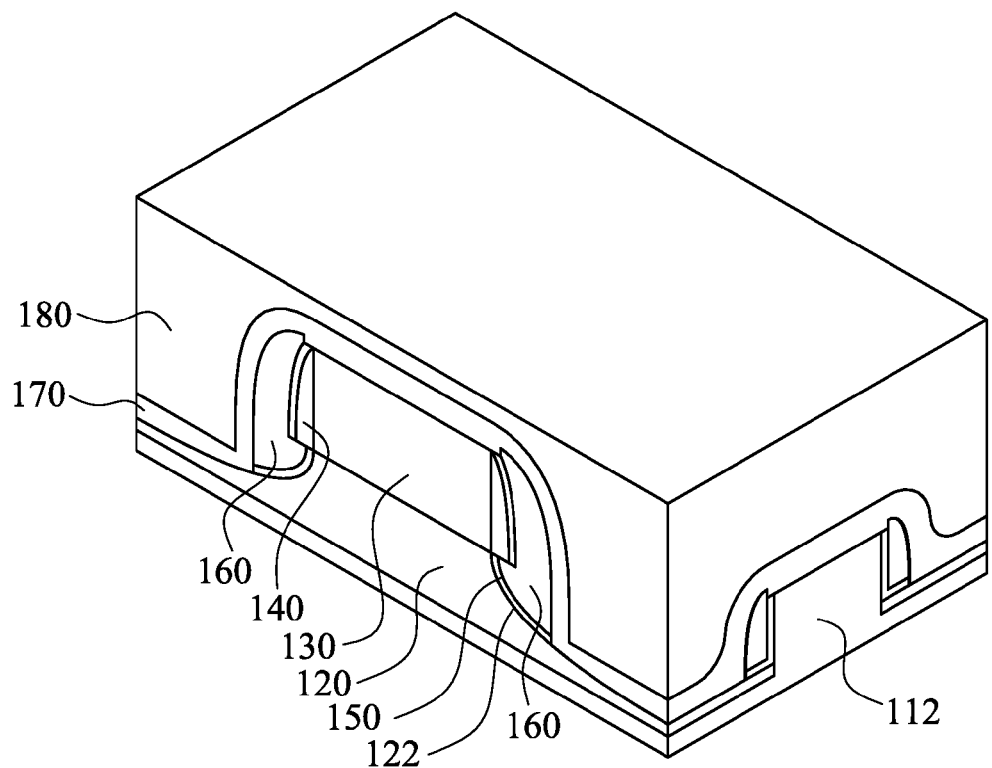

In various embodiments, as shown in FIG. 4H, after forming the insulating layer 160, a contact etch stop layer (CESL) 170 is formed covering the dummy gate 130, the fin structure 112 and the insulating layer 160 before operation S5. In various embodiments, the CESL 170 may be formed of silicon nitride, silicon oxynitride, silicon carbon nitride and/or other suitable insulating material and fabricated by CVD. However, other methods for fabricating the CESL 170 may alternatively be used.

In various embodiments, after forming the CESL 170, an inter-layer dielectric (ILD) layer 180 is formed covering the CESL 170, as shown in FIG. 4H. The ILD layer 180 may be formed of silicon oxide, silicon oxynitride and/or other suitable insulating material and fabricated by CVD, sputtering or other methods known and used in the art for forming the ILD layer 180.

Figure 4I:
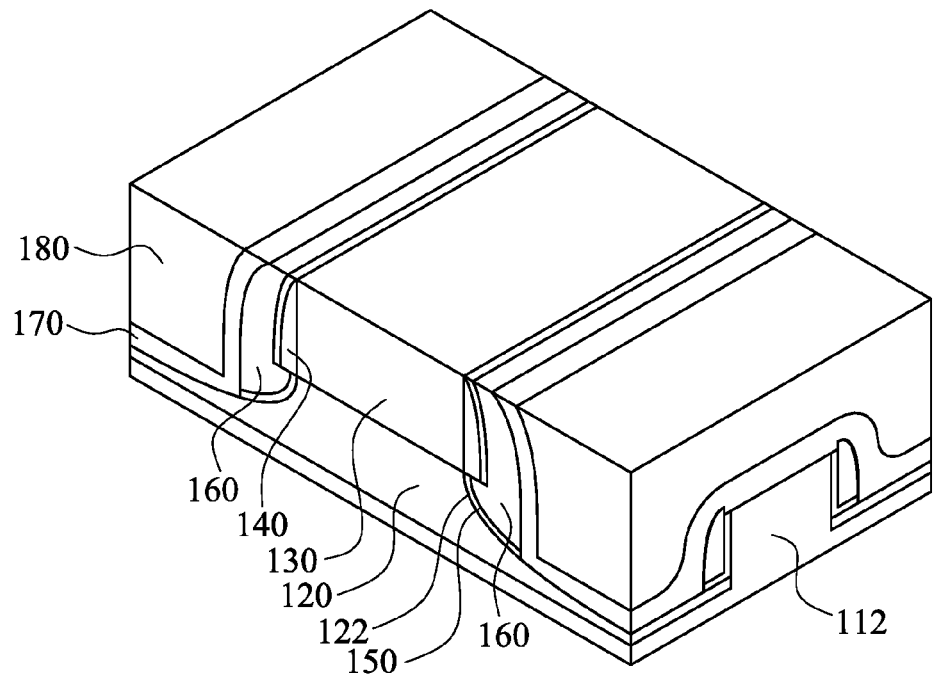

In various embodiments, as shown in FIG. 4I, the method further includes polishing the ILD layer 180 and the CESL 170 to expose an upper surface of the dummy gate 130 before operation S5. In various embodiments, a chemical mechanical polishing (CMP) process is performed on the ILD layer 180, the CESL layer 170 and the insulating layer 160 to form a flat upper surface thereof.

Figure 4J:
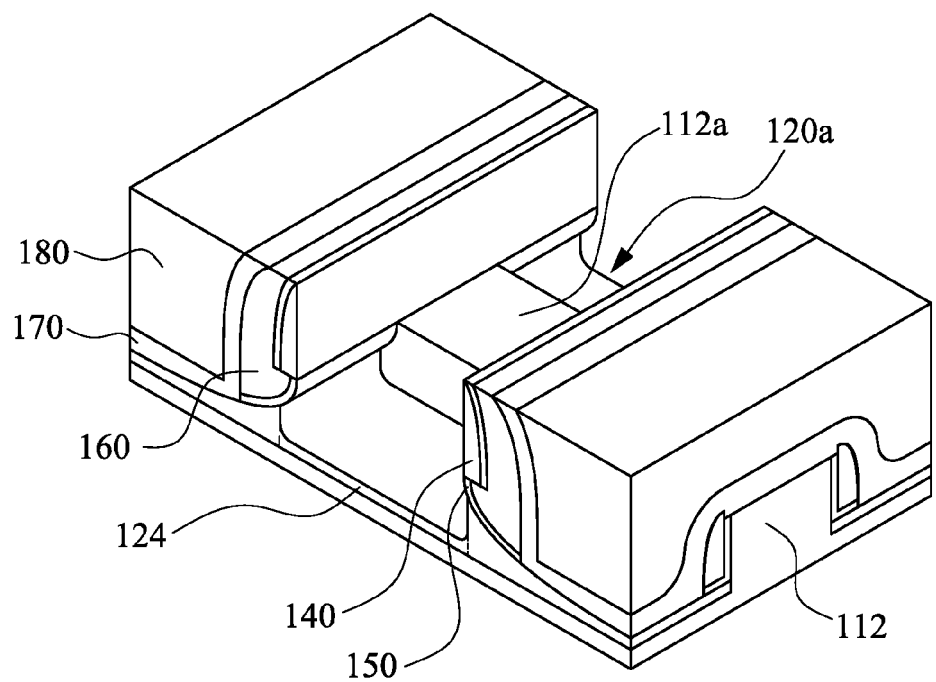

In operation S5, as shown in FIG. 4J, the dummy gate 130 and the two isolation structures 120 beneath the dummy gate 130 are removed to create a cavity 120a confined by the spacers 140 and the gate etch stop layer 150. The gate etch stop layer 150 is not removed due to selectivity of chemicals used in operation S5. That is, the chemicals for removing the dummy gate 130 and the isolation structures 120 thereunderneath are not applicable on the gate etch stop layer 150. Therefore, the gate etch stop layer 150 may be retained after operation S5. The shape and the location of the real gate formed by following operation S6 will be determined by the locations of the gate etch stop layer 150 and the cavity 120a.

Figure 4K:
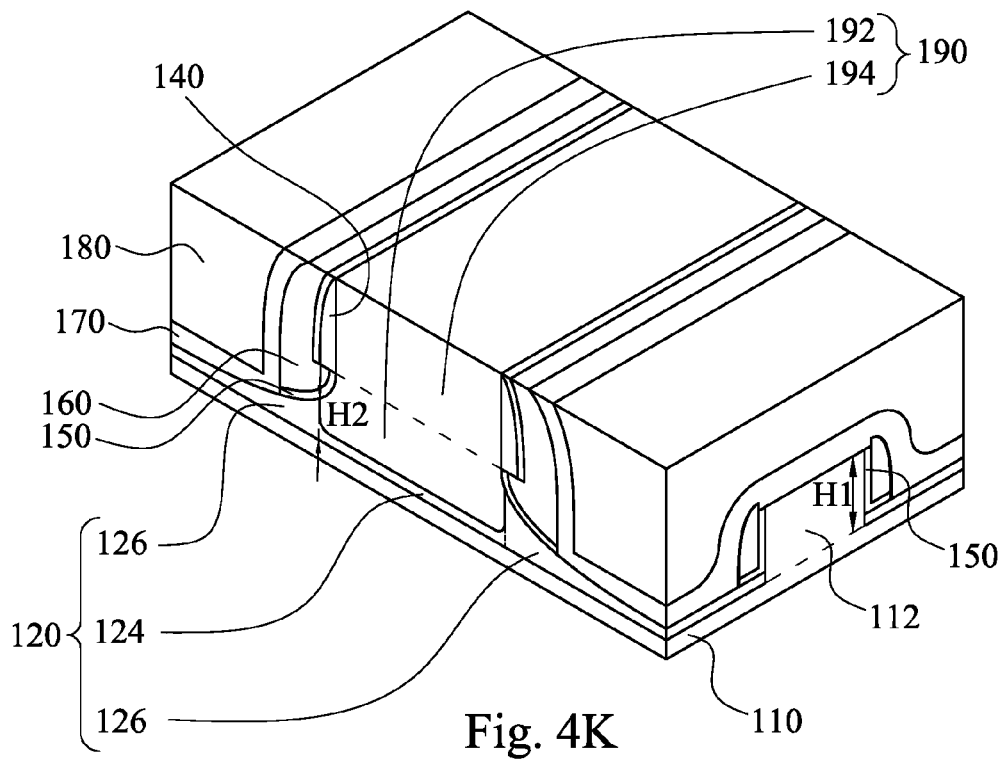

In operation S6, as shown in FIG. 4K, a gate 190 (i.e., the above-mentioned real gate) is formed in the cavity 120a of FIG. 4J. In various embodiments, operation S6 is conducted by depositing a metal-containing material in the cavity 120a. The metal-containing material may include tungsten (W), tantalum (Ta), titanium (Ti), nickel (Ni), TaSiN, TaN, high k metals, or other suitable metals. The metal-containing material may then be polished, so that the gate 190 is substantially planar with upper surfaces of the ILD layer 180, the CESL 170, the insulating layer 160 and the gate etch stop layer 150. Since the shape of the gate 190 is confined by the gate etch stop layer 150, the problems, such as increase of overlap capacitance between gate and source/drain regions and increase of gate leakage current, resulting from a wide bottom of the gate would not occur.

After the gate 190 is formed, the contact windows (not shown) may be formed through the ILD layer 180 and the CESL 170. The contact elements (not shown) may be respectively formed in the contact windows to electrically connect to the source/drain regions 112b, 112c of FIG. 4G.

Figure 5:
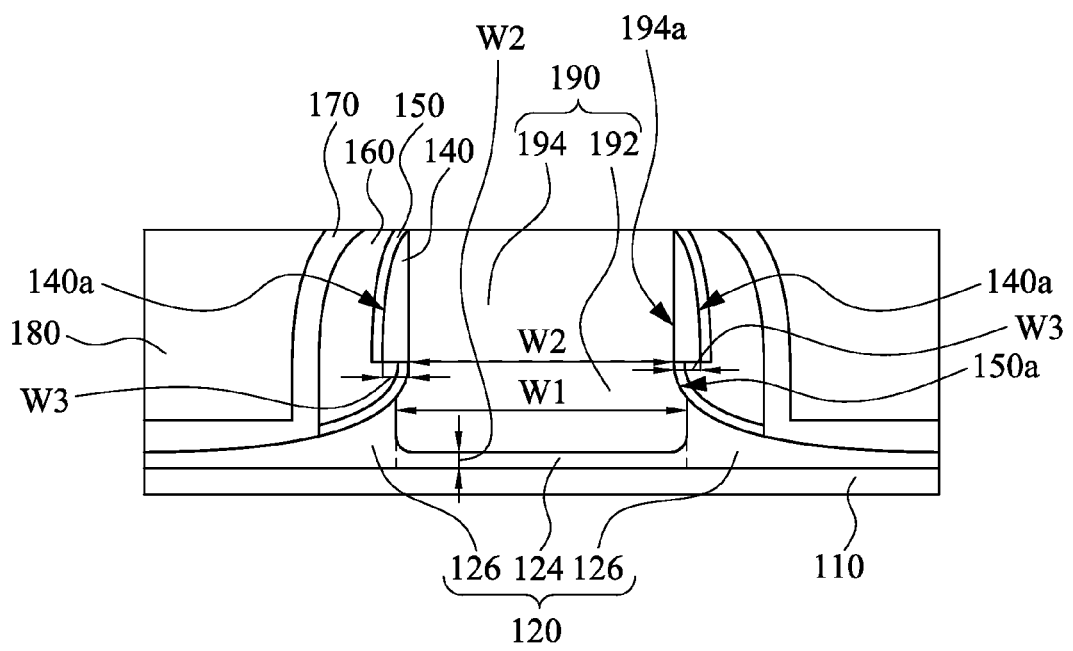
FIG. 5 is a side view of a semiconductor device of FIG. 4K.

Another aspect of the present disclosure provides a semiconductor device. FIG. 5 is a side view of the semiconductor device of FIG. 4K. Referring to FIGS. 4K and 5, the semiconductor device includes a substrate 110, a fin structure 112, two isolation structures 120, a gate 190, two spacers 140 and a gate etch stop layer 150.

The specific features of the substrate 110 may be referred to those exemplified for the substrate 110 above. The fin structure 112 is disposed over the substrate 110. In various embodiments, the substrate 110 has a protruding portion acted as the fin structure 112. The fin structure 112 may include a source region, a drain region and a channel region therebetween. The gate 190 is overlapped with the channel region.

The two isolation structures 120 are disposed over the substrate 110, and the fin structure 112 is disposed between the two isolation structures 120. The two isolation structures 120 are substantially parallel to each other. It is noteworthy that an upper surface of each of the isolation structures 120 is non-planar. As shown in FIG. 5, each of the isolation structures 120 has a recess portion 124 and two slope portions 126 adjacent both sides of the recess portion 124. In other words, the recess portion 124 is located between the two slope portions 126. Boundaries (marked by dotted lines) between the recess portion 124 and the slope portions 126 may be determined by edges of the recess portion 124. Specifically, extension lines along the edges of the recess portion 124 extending within the isolation structure 120 may be acted as the boundaries to differentiate the recess portion 124 and the slope portions 126.

The recess portions 124 is configured to expose portions of both sides of the fin structure 112 and accommodate portions of the gate 190 (i.e., lower portions 192 of the gate 190), as shown in FIG. 4J. The slope portions 126 are inclined downwardly from the edges of the recess portion 124 under the spacers 140 to a position away from the recess portion 124. In various embodiments, as shown in FIG. 4K, each of the slope portions 126 of the two isolation structures 120 has a maximum height H2 lower than a height H1 of the fin structure 112.

The gate 190 is disposed across the fin structure 112, and over the fin structure 112 and the recess portions 124 of the two isolation structures 120. The gate 190 has two lower portions 192 and an upper portion 194. One of the lower portions 192 is marked in FIG. 4K, and another lower portion is disposed at opposite side and thus not marked. A connection between bottoms of the spacers 140 may be acted as a boundary (marked by a dotted line) between the lower portion 192 and the upper portion 194. The two lower portions 192 of the FIG. 4K are respectively disposed over the recess portions 124 of the two isolation structures 120 and contacting the exposed portions of the both sides of the fin structure 112 of FIG. 4J. The upper portion 194 is disposed over the fin structure 112 and bridging the two lower portions 192. In various embodiments, as shown in FIG. 5, each of the two lower portions 192 of the gate 190 has a maximum width W1 less than or equal to a sum of a width W2 of the upper portion 194 of the gate 190 and bottom widths W3 of the two spacers 140 (i.e., W1≤W2+2W3) since the shape of the lower portions 192 is confined by the gate etch stop layer 150.

The two spacers 140 are disposed over both sides of the upper portion 194 of the gate 190. The spacers 140 may be made of silicon oxide, silicon nitride, silicon oxynitride, silicon carbon nitride, or other suitable materials.

The gate etch stop layer 150 is located under the two spacers 140, over the slope portions 126 of the two isolation structures 120 and contacting portions of both sides of each of the two lower portions 192 of the gate 190. The gate etch stop layer 150 may include silicon nitride, silicon carbon nitride, or a combination thereof. In various embodiments, the gate etch stop layer 150 extends from the slope portions 126 of the two isolation structures 120 to the portions of the both sides of each of the two lower portions 192 of the gate 190. In various embodiments, the gate etch stop layer 150 further extends to bottom surfaces of the two spacers 140. In addition, in various embodiments, the gate etch stop layer 150 further covers outer surfaces 140a of the two spacers 140. In various embodiments, the gate etch stop layer 150 further covers another portions of the both sides of the fin structure 112, as shown in FIG. 4K.

Positions of the gate etch stop layer 150 will be described in detail below. In various embodiments, the gate etch stop layer 150 has an edge 150a contacting one side of the lower portion 192 of the gate 190 and a bottom surface of the spacer 140. In various embodiments, one end of the edge 150a is substantially aligned with an edge 194a of the upper portion 194 of the gate 190. However, a semiconductor device with one end of the edge 150a of the gate etch stop layer 150, which contacts the bottom surface of the spacer 140 but not aligned with the edge 194a of the upper portion 194, may also be used. Since the shape of the lower portions 192 of the gate 190 is confined by the edge 150a of the gate etch stop layer 150, the problems, such as increase of overlap capacitance between gate and source/drain regions and increase of gate leakage current, resulting from a wide bottom of gate would not occur.

In various embodiments, the semiconductor device further includes an insulating layer 160 covering the two spacers 140 and the gate etch stop layer 150 thereunder. In various embodiments, the semiconductor device further includes a CESL 170 covering the insulating layer 160. In various embodiments, the semiconductor device further includes an ILD layer 180 covering the CESL 170. The specific features of the insulating layer 160, the CESL 170 and the ILD layer 180 may be referred to those exemplified for the insulating layer 160, the CESL 170 and the ILD layer 180 above.

Furthermore, the semiconductor device may further include contact elements (not shown) contacting the source/drain regions. The contact elements may be made of tungsten, tungsten-based alloy, copper, copper-based alloy or other suitable conductive materials.

A method for manufacturing a semiconductor device includes forming two isolation structures in a substrate to define a fin structure between the two isolation structures in the substrate. A dummy gate and spacers are formed bridging the two isolation structures and over the fin structure. The two isolation structures are etched with the dummy gate and the spacers as a mask to form a plurality of slopes under the spacers in the two isolation structures. A gate etch stop layer is formed overlying the plurality of slopes. The dummy gate and the two isolation structures beneath the dummy gate are removed to create a cavity confined by the spacers and the gate etch stop layer. A gate is then formed in the cavity.

A semiconductor device includes a substrate, a fin structure, two isolation structures, a gate, two spacers and a gate etch stop layer. The fin structure is over the substrate. The two isolation structures are over the substrate. The fin structure is between the two isolation structures. Each of the two isolation structures has a recess portion and two slope portions adjacent both sides of the recess portion, and the recess portion is configured to expose portions of both sides of the fin structure. The gate is across the fin structure, and over the fin structure and the recess portions of the two isolation structures. The gate has two lower portions and an upper portion, and the two lower portions are over the recess portions of the two isolation structures and contacting the portions of the both sides of the fin structure, and the upper portion is over the fin structure and bridging the two lower portions. The two spacers are over both sides of the upper portion of the gate. The gate etch stop layer is under the two spacers, over the slope portions of the two isolation structures and contacting portions of both sides of each of the two lower portions of the gate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a substrate;
   a fin structure over the substrate;
   two isolation structures over the substrate, the fin structure between the two isolation structures, wherein each of the two isolation structures has a recess portion and two slope portions adjacent both sides of the recess portion, the recess portions configured to expose portions of both sides of the fin structure;
   a gate across the fin structure, and over the fin structure and the recess portions of the two isolation structures, wherein the gate has two lower portions and an upper portion, the two lower portions over the recess portions of the two isolation structures and contacting the portions of the both sides of the fin structure, the upper portion over the fin structure and bridging the two lower portions;
   two spacers over both sides of the upper portion of the gate; and
   a gate etch stop layer under the two spacers, over the slope portions of the two isolation structures and contacting portions of both sides of each of the two lower portions of the gate.

2. The semiconductor device of claim 1, wherein the gate etch stop layer extends from the slope portions of the two isolation structures to the portions of the both sides of each of the two lower portions of the gate.

3. The semiconductor device of claim 2, wherein the gate etch stop layer further extends to bottom surfaces of the two spacers.

4. The semiconductor device of claim 1, wherein each of the two lower portions of the gate has a maximum width less than or equal to a sum of a width of the upper portion of the gate and bottom widths of the two spacers.

5. The semiconductor device of claim 1, wherein each of the slope portions of the two isolation structures has a maximum height lower than a height of the fin structure.

6. The semiconductor device of claim 1, wherein the gate etch stop layer has an edge substantially aligned with an edge of the upper portion of the gate.

7. The semiconductor device of claim 1, wherein the gate etch stop layer further covers outer surfaces of the two spacers.

8. The semiconductor device of claim 1, wherein the gate etch stop layer further covers another portions of the both sides of the fin structure.

9. The semiconductor device of claim 1, further comprising an insulating layer covering the gate etch stop layer and the two spacers.

10. The semiconductor device of claim 9, further comprising a CESL covering the insulating layer and the fin structure.

11. The semiconductor device of claim 10, further comprising an inter-layer dielectric (ILD) layer covering the CESL.

12. The semiconductor device of claim 9,
    wherein the gate etch stop layer has another edge continuous with an edge of the insulating layer.

13. The semiconductor device of claim 1, wherein the gate etch stop layer comprises silicon nitride, silicon carbon nitride, or a combination thereof.

14. The semiconductor device of claim 1, wherein each of the two slope portions is inclined downwardly from an edge of the recess portion under one of the two spacers to a position away from the recess portion.

15. The semiconductor device of claim 1, wherein the gate etch stop layer is in contact with a bottom surface of one of the two spacers.

16. The semiconductor device of claim 1, wherein the gate etch stop layer has a uniform or substantially uniform thickness.

17. The semiconductor device of claim 1, wherein a bottom width of each of the two spacers is greater than a thickness of the gate etch stop layer.

18. The semiconductor device of claim 1, wherein the gate comprises tungsten, tantalum, titanium, nickel, TaSiN or TaN.

19. The semiconductor device of claim 1, wherein the two spacers are made of silicon oxide, silicon nitride, silicon oxynitride or silicon carbon nitride.

20. The semiconductor device of claim 1, wherein the two isolation structures are made of silicon oxide, silicon nitride, silicon oxynitride or fluoride-doped silicate glass.

* * * * *